US006525864B1

(12) United States Patent
Gee et al.

(10) Patent No.: US 6,525,864 B1
(45) Date of Patent: Feb. 25, 2003

(54) INTEGRATED MIRROR ARRAY AND CIRCUIT DEVICE

(75) Inventors: Dale A. Gee, Los Gatos, CA (US); Xiao Yang, Fremont, CA (US); Anup K. Nayak, Fremont, CA (US)

(73) Assignee: Nayna Networks, Inc., Milpitas, CA (US)

(*) Notice: Subject to any disclaimer, the term of this patent is extended or adjusted under 35 U.S.C. 154(b) by 2 days.

(21) Appl. No.: 09/770,527

(22) Filed: Jan. 25, 2001

Related U.S. Application Data (60) Provisional application No. 60/219,798, filed on Jul. 20, 2000.

(51) Int. Cl.[7] .............................................. G02B 26/00
(52) U.S. Cl. ...................... 359/291; 359/291; 359/295
(58) Field of Search ................ 359/290, 291, 359/293, 295, 224, 298; 310/36, 90; 348/770, 771, 772

(56) References Cited

U.S. PATENT DOCUMENTS

| | | | |
|---|---|---|---|
| 4,317,611 A | 3/1982 | Petersen ...................... | 359/214 |
| 4,632,513 A | 12/1986 | Stowe et al. .................. | 216/24 |
| 4,754,185 A | 6/1988 | Gabriel et al. .............. | 310/309 |
| 4,772,085 A | 9/1988 | Moore et al. ................. | 385/43 |
| 4,798,438 A | 1/1989 | Moore et al. ................. | 385/43 |
| 4,834,481 A | 5/1989 | Lawson et al. ............... | 385/44 |
| 4,942,766 A | 7/1990 | Greenwood et al. .......... | 73/704 |
| RE33,296 E | 8/1990 | Stowe et al. .................. | 385/15 |
| 4,959,699 A | 9/1990 | Lidow et al. ............... | 257/328 |
| 5,147,851 A | 9/1992 | Yamana et al. ............. | 505/220 |
| 5,355,426 A | 10/1994 | Daniel et al. ................. | 385/39 |
| 5,378,954 A | 1/1995 | Higuchi et al. ............. | 310/309 |

(List continued on next page.)

FOREIGN PATENT DOCUMENTS

| | | |
|---|---|---|
| WO | WO 99/20218 | 4/1999 |
| WO | WO99/21139 | 4/1999 |

OTHER PUBLICATIONS

Niino et al., "Dual Excitation Multiphase Electrostatic Drive," *IEEE* 0–7803–3008–0/95 pp. 1318–1324 (1995).

Niino et al., "Development of An Electrostatic Actuator Exceeding 10N Propulsive Force," *IEEE* 0–7803–0497–7/92, Micro Electro Mechanical Systems '92, Travemunde (Germany) pp. 122–127 (1992). Feb.

Niino et al., "High–Power and High–Efficiency Electrostatic Actuator," *IEEE* 0–7803–0957–2/93, pp. 236–241 (1993).

Trimmer et al., "Design Considerations For A Practical Electrostatic Micro–Motor," *Sensors and Actuators*, 11:189–206 (1997).

*Primary Examiner*—Georgia Epps
*Assistant Examiner*—Gary O'Neill
(74) *Attorney, Agent, or Firm*—Townsend and Townsend and Crew LLP

(57) ABSTRACT

An integrated circuit and mirror device. The device includes a first substrate comprising a plurality of electrode groups, wherein each of the groups comprises a plurality of electrodes. A mirror array is formed on a second substrate. Each of the mirrors on the array has a mirror surface being able to pivot about a point (e.g., fixed point, region) in space. Each of the mirrors has a backside surface operably coupled to one of the electrode groups. A bonding layer mechanically couples the first substrate to the second substrate, whereupon the backside surface of each mirror faces one of the electrode groups. The device also has a drive circuitry coupled to each electrode groups. The drive circuitry is configured to apply a voltage to any one of the electrodes in each of the electrode groups. The drive circuitry is disposed in the first substrate and being adapted to pivot each of the mirror faces about the point in space.

25 Claims, 8 Drawing Sheets

U.S. PATENT DOCUMENTS

| | | | |
|---|---|---|---|
| 5,444,801 A | 8/1995 | Laughlin | 385/16 |
| 5,488,862 A | 2/1996 | Neukermans et al. | 73/504.02 |
| 5,500,917 A | 3/1996 | Daniel et al. | 385/99 |
| 5,534,740 A | 7/1996 | Higuchi et al. | 310/309 |
| 5,555,327 A | 9/1996 | Laughlin | 385/16 |
| 5,555,558 A | 9/1996 | Laughlin | 385/16 |
| 5,566,260 A | 10/1996 | Laughlin | 385/16 |
| 5,627,925 A | 5/1997 | Alferness et al. | 385/17 |
| 5,629,790 A | 5/1997 | Neukermans et al. | 359/198 |
| 5,644,666 A | 7/1997 | Campbell et al. | 385/43 |
| 5,647,033 A | 7/1997 | Laughlin | 385/16 |
| 5,648,618 A | 7/1997 | Neukermans et al. | 73/862.08 |
| 5,658,710 A | 8/1997 | Neukermans | 430/320 |
| 5,682,453 A | 10/1997 | Daniel et al. | 385/99 |
| 5,693,541 A | 12/1997 | Yamazaki et al. | 437/21 |
| 5,721,796 A | 2/1998 | de Barros et al. | 385/37 |
| 5,787,214 A | 7/1998 | Harpin et al. | 385/49 |
| 5,835,256 A * | 11/1998 | Huibers | 359/291 |
| 5,841,553 A | 11/1998 | Neukermans | 358/494 |
| 5,841,916 A | 11/1998 | Laughlin | 385/16 |
| 5,861,549 A | 1/1999 | Neukermans | 73/105 |
| 5,872,880 A | 2/1999 | Maynard | 385/88 |
| 5,875,271 A | 2/1999 | Laughlin | 385/16 |
| 5,881,190 A | 3/1999 | Harpin et al. | 385/49 |
| 5,907,650 A | 5/1999 | Sherman et al. | 385/80 |
| 5,909,301 A | 6/1999 | Laughlin | 359/222 |
| 5,917,641 A | 6/1999 | Laughlin | 359/222 |
| 5,943,158 A | 8/1999 | Ford et al. | 359/295 |
| 5,959,767 A | 9/1999 | Fatchi et al. | 359/341 |
| 5,960,133 A | 9/1999 | Tomlinson | 383/18 |
| 5,969,465 A | 10/1999 | Neukermans et al. | 310/333 |
| 5,986,381 A | 11/1999 | Hoen et al. | 310/309 |
| 6,002,514 A | 12/1999 | Barret et al. | 359/13.2 |
| 6,021,248 A | 2/2000 | Cornish et al. | 385/147 |
| 6,031,946 A | 2/2000 | Bergmann et al. | 385/18 |
| 6,044,705 A | 4/2000 | Neukermans et al. | 73/504.02 |
| 6,046,840 A * | 4/2000 | Huibers | 359/291 |
| 6,049,644 A | 4/2000 | Dragone | 385/37 |
| 6,063,299 A | 5/2000 | Drake et al. | 216/24 |
| 6,064,779 A | 5/2000 | Neukermans et al. | 382/313 |
| 6,075,914 A | 6/2000 | Yeandle | 385/49 |
| 6,078,711 A | 6/2000 | Yeandle et al. | 385/49 |
| 6,088,496 A | 7/2000 | Asghari | 385/37 |
| 6,101,210 A | 8/2000 | Bestwick et al. | 372/96 |
| 6,108,118 A * | 8/2000 | Minamoto | 359/224 |
| 6,108,472 A | 8/2000 | Rickman et al. | 385/48 |
| 6,108,478 A | 8/2000 | Harpin et al. | 385/129 |
| 6,123,985 A | 9/2000 | Robinson et al. | 427/162 |
| 6,175,443 B1 | 1/2001 | Aksyuk et al. | 359/291 |
| 6,188,814 B1 | 2/2001 | Bhalla | 315/13 |
| 6,204,946 B1 | 3/2001 | Aksyuk et al. | 359/131 |
| 6,205,267 B1 | 3/2001 | Aksyuk et al. | 385/19 |
| 6,215,222 B1 | 4/2001 | Hoen | 310/309 |
| 6,253,001 B1 | 6/2001 | Hoen | 385/17 |
| 6,275,326 B1 * | 8/2001 | Bhalla et al. | 359/298 |
| 6,301,402 B1 | 10/2001 | Bhalla et al. | 385/16 |
| 6,304,694 B1 | 10/2001 | Ford | 385/33 |

* cited by examiner

INTEGRATED MIRROR ARRAY AND CIRCUIT DEVICE

CROSS-REFERENCE TO RELATED APPLICATIONS

This application claims priority to U.S. Provisional Application Ser. No. 60/219,798 filed Jul. 20, 2000, commonly assigned, and hereby incorporated herein by reference for all purposes.

This application is also being filed concurrently with U.S. Ser. Nos. 09/770,935 and 09/771,296, each of which is commonly assigned and hereby incorporated herein by reference for all purposes.

BACKGROUND OF THE INVENTION

This invention generally relates to techniques for optical switching. More particularly, the present invention provides a device having a novel mirror configuration, which integrates a mirror array with an integrated circuit. Merely by way of example, the present invention is implemented using such device in a wide area network for long haul telecommunications, but it would be recognized that the invention has a much broader range of applicability. The invention can be applied to other types of networks including local area networks, enterprise networks, and the like.

Digital telephone has progressed with the need for faster communication networks. Conventionally, standard analog voice telephone signals have been converted into digital signals. These signals can be 64,000 bits/second and greater in some applications. Other telephone circuits interleave these bit streams from 24 digitized phone lines into a single sequence of 1.5 Mbit/second, commonly called the T1 or DS1 rate. The T1 rate feeds into higher rates such as T2 and T3. A T4 may also be used. Single mode fiber optics have also been used at much higher speeds of data transfer. Here, optical switching networks have also been improved. An example of such optical switching standard is called the Synchronous Optical Network (SONET), which is a switching standard designed for telecommunications to use transmission capacity more efficiently than the conventional digital telephone hierarchy, which was noted above. SONET organizes data into 810-byte "frames" that include data on signal routing and designation as well as the signal itself. The frames can be switched individually without breaking the signal up into its components, but still require conventional switching devices.

Most of the conventional switching devices require the need to convert optical signals from a first source into electric signals for switching such optical signals over a communication network. Once the electric signals have been switched, they are converted back into optical signals for transmission over the network. As merely an example, a product called the SN 16000, BroadLeaf™ Network Operating System (NOS), made by Sycamore Networks, Inc. uses such electrical switching technique. Numerous limitations exist with such conventional electrical switching technique. For example, such electrical switching often requires a lot of complex electronic devices, which make the device difficult to scale. Additionally, such electronic devices become prone to failure, thereby influencing reliability of the network. The switch is also slow and is only as fast as the electrical devices. Accordingly, techniques for switching optical signals using a purely optical technology have been proposed. Such technology can use a wave guide approach for switching optical signals. Unfortunately, such technology has been difficult to scale and to build commercial devices.

Other companies have also been attempting to develop technologies for switching high number of signals in other manners such as high density mirror arrays, but have been generally unsuccessful. One of the major obstacles to manufacturing high-density mirror arrays is the sheer number of interconnects that must come out of the mirrors for control and sensing. Another issue that arises is that since the mirrors are so small the capacitance values (fempto-farads) that one uses to sense the mirror position are equally as small that if one tries to sense the capacitance "off-chip" the signal is buried in the noise of the stray capacitance from the interconnects. Accordingly, such attempts have been unsuccessful.

From the above, it is seen that an improved way to switching a plurality of optical signal is highly desirable.

SUMMARY OF THE INVENTION

According to the present invention, a technique including a device for optical switching is provided. More particularly, the invention provides an integrated circuit and mirror device. Merely by way of example, the present invention is implemented using such a device in a wide area network for long haul telecommunications, but it would be recognized that the invention has a much broader range of applicability. The invention can be applied to other types of networks including local area networks, enterprise networks, and the like.

In a specific embodiment, the present invention provides an integrated circuit and mirror device. The device includes a first substrate comprising a plurality of electrode groups, wherein each of the groups comprises a plurality of electrodes. A mirror array is formed on a second substrate. Each of the mirrors on the array has a mirror surface being able to pivot about a point (e.g., fixed point, region) in space. Each of the mirrors has a backside surface operably coupled to one of the electrode groups. A bonding layer mechanically couples the first substrate to the second substrate, whereupon the backside surface of each mirror faces one of the electrode groups. The device also has a drive circuitry coupled to each electrode groups. The drive circuitry is configured to apply a voltage to any one of the electrodes in each of the electrode groups. The drive circuitry is disposed in the first substrate and is adapted to pivot each of the mirror faces about the point in space to reflect optical signals.

In an alternative embodiment, the invention provides an integrated circuit and mirror device. The device has a first substrate bonded to a second substrate. The first substrate has a plurality of electrode groups disposed in a spatial manner, where each of the groups comprises a plurality of electrodes. A mirror array is formed on the second substrate. Each of the mirrors on the array has a mirror surface being able to pivot about a point (e.g., fixed, region) in space. Each of the mirrors also has a backside surface operably coupled to one of the electrode groups. A bonding layer mechanically couples the first substrate to the second substrate, whereupon the backside surface of each mirror faces one of the electrode groups. A drive circuitry is coupled to each electrode groups. The drive circuitry is configured to apply a voltage to any one of the electrodes in each of the electrode groups. The drive circuitry is disposed in the first substrate and is adapted to pivot each of the mirror faces about the point in space. The device has a sense circuit coupled between each of the electrodes and the drive circuitry, an input/output circuit coupled to the drive circuitry, and a plurality of pads coupled to the input/output circuit.

Many benefits are achieved by way of the present invention over conventional techniques. In a specific embodiment, the invention provides an integrated solution for controlling each of the mirrors on the array using integrated circuit technology. Additionally, the invention can be made using conventional semiconductor technology. In other aspects, the invention reduces a number of possible interconnects, which interface to a controller device, e.g., computer, network switching module. The invention is easy to make and can be used to form highly integrated and large density mirror arrays, e.g., 100, 500, 1000, 5000, 10,000 and greater. The invention also has the ability to sense small variations in capacitance to sense movement of the mirrors. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DESCRIPTION OF THE SPECIFIC EMBODIMENTS

According to the present invention, a technique including a device for optical switching is provided. More particularly, the invention provides an integrated circuit and mirror device. Merely by way of example, the present invention is implemented using such a device in a wide area network for long haul telecommunications, but it would be recognized that the invention has a much broader range of applicability. The invention can be applied to other types of networks including local area networks, enterprise networks, and the like.

Figure 1:
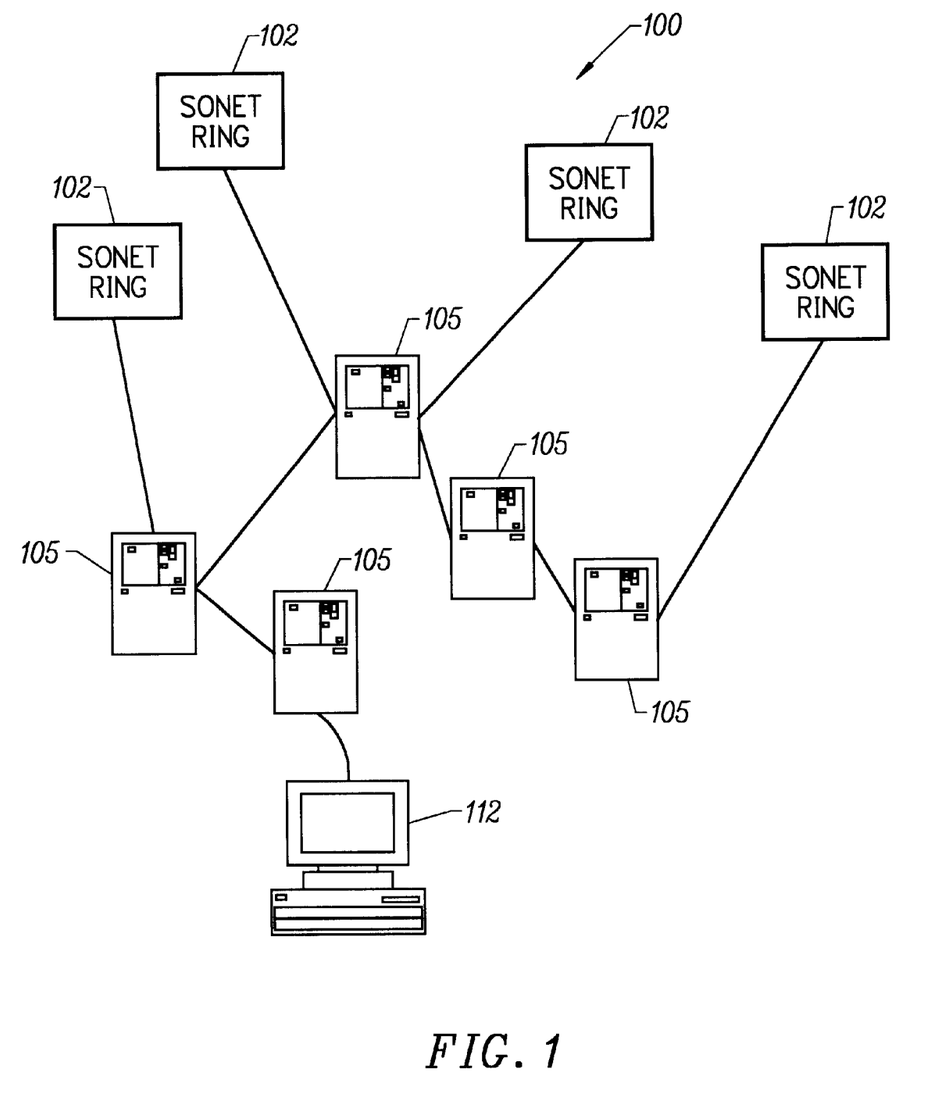
FIG. 1 is simplified diagram of an optical switching network according to an embodiment of the present invention.

FIG. 1 is simplified diagram 100 of a optical switching network according to an embodiment of the present invention. This diagram is merely an example, which should not unduly limit the scope of the claims herein. One of ordinary skill in the art would recognize many other variations, modifications, and alternatives. As shown, the diagram illustrates an optical network system 100 including a plurality of SONET rings 102. Each of the SONET rings is coupled to one or more network switching systems 105, which are coupled to each other. The network switching systems can be coupled to long haul optical network system. In a specific embodiment, each of the switching systems switches an optical signal from one of the rings to another one of the rings, where the transmission path is substantially optical. That is, the signal is not converted into an electrical signal via an optoelectronic device, which is coupled to an electrical switch that switches the signal. In the present embodiment, the transmission path is substantially optical. Further details of the switching system are provided below.

Although the above has been described in terms of specific hardware features, it would be recognized that there can be many alternatives, variations, and modifications. For example, any of the above elements can be separated or combined. Alternatively, some of the elements can be implemented in software or a combination of hardware and software. Alternatively, the above elements can be further integrated in hardware or software or hardware and software or the like. It is also understood that the examples and embodiments described herein are for illustrative purposes only and that various modifications or changes in light thereof will be suggested to persons skilled in the art and are to be included within the spirit and purview of this application and scope of the appended claims.

Figure 2:
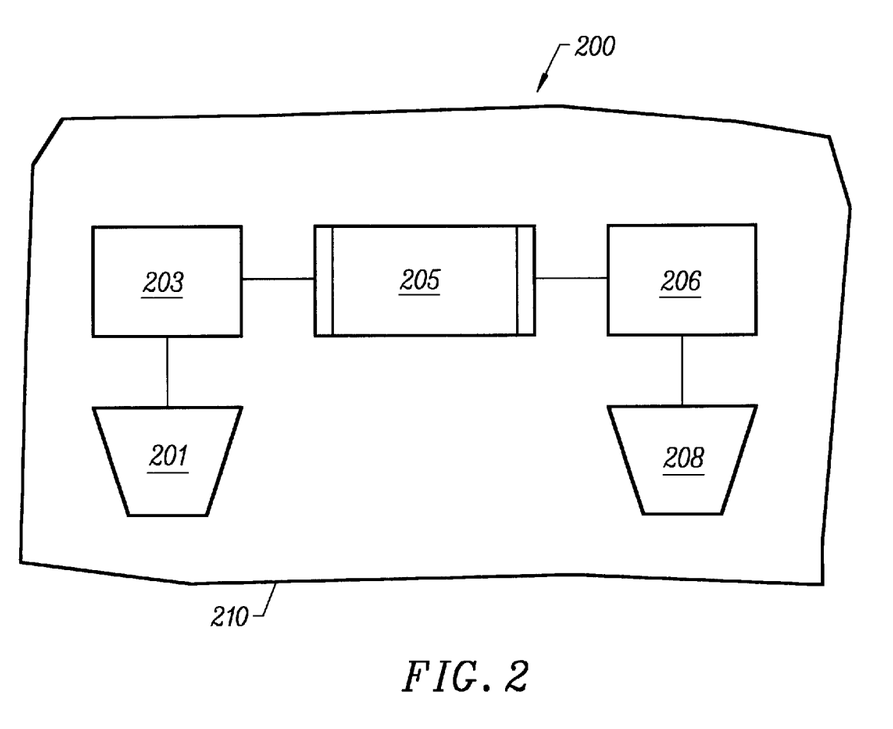
FIG. 2 is a simplified diagram of an optical switching apparatus according to an embodiment of the present invention.

FIG. 2 is a simplified diagram of an optical switching apparatus 200 according to an embodiment of the present invention. This diagram is merely an example, which should not unduly limit the scope of the claims herein. One of ordinary skill in the art would recognize many other variations, modifications, and alternatives. As shown, the apparatus 200 includes a variety of features such as input source 201 (from fiber bundle) and output 208. The input source is coupled to housing including lens array 203. Lens array is coupled to mirror arrays 205. Further details of the mirror arrays are provided below. The mirror arrays are coupled to lens array 206, which couples to output fiber bundle 208.

As merely an example, the signal pathway traverses through the apparatus from input source 201 to output 208. Here, the signal pathway begins at the input source 201, which is from the fiber bundle. The signal traverses through a lens in the lens array 203, which focuses the signal. The signal traverses through the mirror arrays, which switch the signal between any one of a plurality of output fibers. The signal traverses from the mirror arrays to a lens, which is on lens array 206 to focus the signal. The signal is then output 208. Other steps can be performed depending upon the embodiment.

The present apparatus provides a pure optical pathway during switching in preferred embodiments. Preferably, the optical pathway is substantially free from any electrical switching of conventional devices. Other benefits would be recognized by one of ordinary skill in the art.

Additionally, the apparatus can become smaller in size using the novel configuration, and has a better form factor. In a specific embodiment, the apparatus has a small form factor. The form factor can be a few inches or less per side. In some embodiments, the apparatus is sealed using a non-reactive gas. The gas can be selected from any suitable compounds. For example, the gas can include nitrogen, argon, helium, and the like. The gas is preferably free from any oxygen bearing compounds, which can lead to oxidation. The sealed apparatus has a submicron (e.g., 0.5 or less) sized particle count of less than 10 ppm. The various features from input source 201 through output 208 are sealed from the environment.

The system also does not include electrical devices, which can be prone to error and the like. Since a lot of conventional electrical hardware has been eliminated, the present apparatus is reliable and is less prone to error. The apparatus also has a modular design, which can be easy to repair and/or replace. Here, a technician can easily remove the apparatus from the network and replace it with another apparatus. The overall system switching speed is 50 milliseconds or less in the apparatus for conventional networks, but can be much lower in other environments. In the present invention, the switching speed for the apparatus is 15 milliseconds or less or even 5 milliseconds or less. Preferably, the apparatus also conforms to Telecordia standards. There are many other benefits, which would be recognized by one of ordinary skill in the art.

Although the above has been described in terms of specific hardware features, it would be recognized that there can be many alternatives, variations, and modifications. For example, any of the above elements can be separated or combined. Alternatively, some of the elements can be implemented in software or a combination of hardware and software. Alternatively, the above elements can be further integrated in hardware or software or hardware and software or the like. It is also understood that the examples and embodiments described herein are for illustrative purposes only and that various modifications or changes in light thereof will be suggested to persons skilled in the art and are to be included within the spirit and purview of this application and scope of the appended claims.

Figure 3:
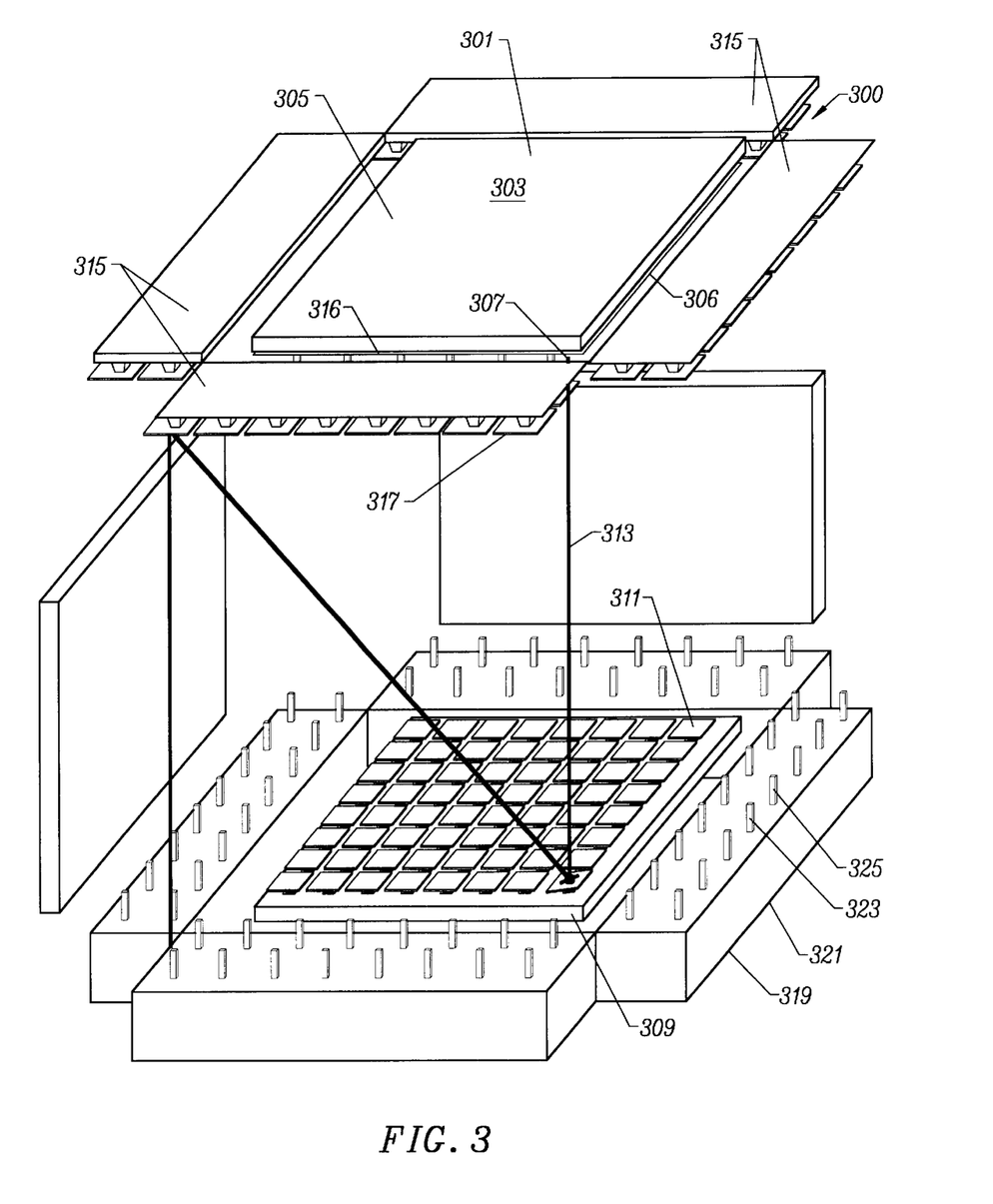
FIG. 3 is a simplified diagram of an optical switching device according to an embodiment of the present invention.

FIG. 3 is a simplified diagram of an optical switching device 300 according to an embodiment of the present invention. This diagram is merely an example, which should not unduly limit the scope of the claims herein. One of ordinary skill in the art would recognize many other variations, modifications, and alternatives. As shown, the device 300 for switching one of a plurality of optical signals from a plurality of optical fibers 301 is provided. The device has an input fiber bundle housing 303 comprising an outer side 305 and an inner side 306. The input fiber bundle housing has a plurality of sites 307 oriented in a spatial manner on the outer side for coupling to a plurality of input optical fibers. Each of the input optical fibers is capable of transmitting an optical signal. Preferably, the signal is transmitted through a lens, which is described in more detail below. The apparatus also has a first mirror array 309 disposed facing the inner side of the input fiber bundle housing. The first mirror array 309 includes a plurality of mirrors 311. Each of the mirrors 311 corresponds to one 313 of the sites on the outer side of the input fiber bundle housing. A second mirror array 315 is disposed facing the first mirror array. The second mirror array is also disposed around a periphery 316 of the input fiber bundle housing. The second mirror array also has a plurality of mirrors 317, where each of the mirrors is capable of directing at least one signal from one of the mirrors on the first mirror array. The device has an output fiber bundle housing 319 comprising an outer side 321 and an inner side 323. The output fiber bundle housing has a plurality of sites 325 oriented in a spatial manner on the outer side for coupling to a plurality of output optical fibers. Each of the sites is capable of receiving at least one signal from one of the second mirrors.

The housing is made of a suitable material that is sufficiently rigid to provide a structural support. Additionally, each housing also has sufficient characteristics to house a fiber optic member. Furthermore, the material also has the ability to provide an array of fiber optic sites, which house fiber optic members. The material can include a conductor, an insulator, or a semiconductor, or any combination of these, as well as multi-layered structures. The housing is preferably made of a similar material as the mirror array to cancel out any thermal expansion/contraction influences. Preferably, the material is silicon, but can also be other materials. Desirable, the material is also easy to machine and resists environmental influences. The housing also is capable of coupling to a lens and/or lens array, which will be described in more detail below.

The mirror can be any suitable mirror for adjusting a deflection of an optical signal(s). The mirror can be suspended on torsion bars, which adjust a spatial positioning of the mirrors. The torsion bars can be driven by electrostatic drive means, but can be others. As merely an example, U.S. Pat. No. 6,044,705 assigned to Xros, Inc., Sunnyvale, Calif. describes such a mirror in a specific manner. Alternatively, U.S. Pat. No. 4,317,611, assigned to International Business Machines Corporation, also describes such a mirror. It would be recognized by one of ordinary skill in the art that many other variations, alternatives, and modifications can exist.

Although the above has been described in terms of where the output arrays are split into a plurality of smaller arrays, the input arrays can also be split into a plurality of smaller arrays. Here, the output array would be a single piece larger array. Alternatively, each of the arrays can be split into a plurality of smaller sections or arrays. Each of these arrays can be of a similar size or a different size, depending upon the embodiment. The arrays can also be in a variety of shapes such as annular, trapezoidal, a combination of these, and others. These and other configurations would be recognized by one of ordinary skill in the art, where there can be many variations, modifications, and alternatives.

Figure 4:
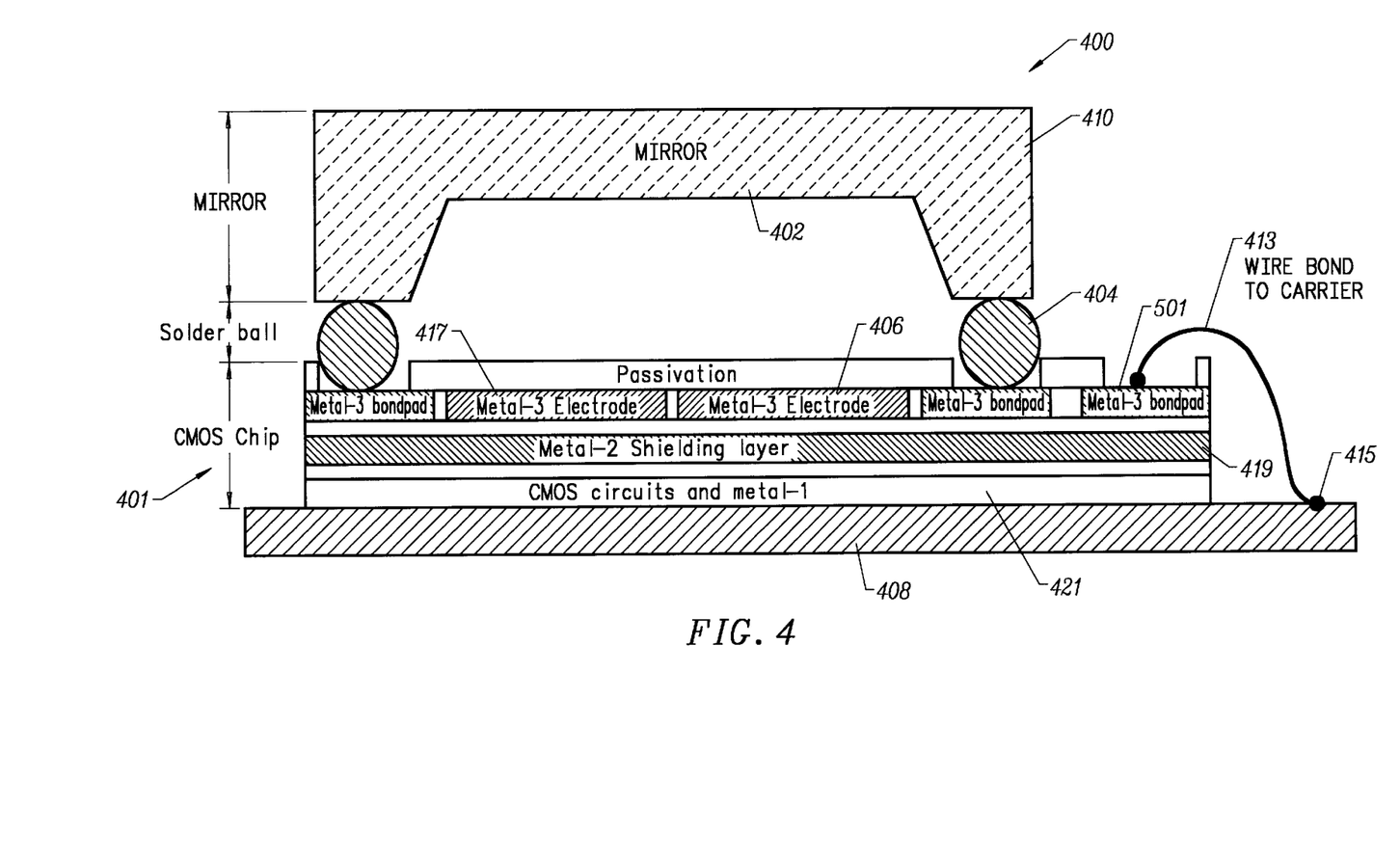
FIG. 4 is a detailed diagram of a mirror array coupled to drive circuitry according to an embodiment of the present invention.

FIG. 4 is a detailed diagram of a mirror array coupled to drive circuitry 400 according to an embodiment of the present invention. This diagram is merely an example which should not unduly limit the scope of the claims herein. One of ordinary skill in the art would recognize many other variations, modifications, and alternatives. As shown, the mirror array 410 couples to substrate 401, which was previously detached from the mirror array. The mirror array can be one of the above, as well as others, which are driven by electrode devices. The mirror array and substrate couple to each other through bonding layer 404. The substrate is often a silicon substrate, which can be made using a semiconductor fabrication process or processes. The silicon substrate can include a variety of electrical circuits for driving electrodes 406, which move each one of the mirrors 402 on the mirror array.

As shown, the silicon substrate has a plurality of electrode groups 406 on an upper surface portion of the substrate. A dielectric layer underlies the electrode groups. Each of the electrodes couples to lines, which couple to drive circuitry. The dielectric layer can be any suitable material such as silicon dioxide, silicon nitride, doped silicon glass, spin-on-glass, and the like. The dielectric layer can be a single layer or multiple layers. The electrodes groups are made of a suitable conductive material, such as aluminum, copper, gold, aluminum alloys, and the like. The material can also be titanium, tungsten, or other barrier type material. The electrodes can also be any combination of these, as well as others. In some embodiments, a dielectric layer or insulating layer can be formed overlying the electrodes. The dielectric layer can be used to protect the electrodes. The dielectric layer can be can be any suitable material such as silicon dioxide, silicon nitride, aluminum dioxide, doped silicon glass, spin-on-glass, and the like. The dielectric layer can be a single layer or multiple layers. The dielectric layer, however, is thin enough to allow the electrodes to influence movement of the mirrors on the array.

The substrate includes at least first 421, second 419, and third 421 metal layers, but can also be fewer metal layers. The second metal layer can be used as a shielding layer, which electrically isolates the integrated circuit device layer from the electrodes. The third metal layer can be used for the electrodes, as noted above. The first metal layer can be used for integrated circuit elements including drive circuitry, sense electrodes for the mirror, which are able to pick up the very low capacitance values without suffering the noise from the interconnects. The substrate can be made using technology of NMOS, CMOS, bipolar, or any combination of these. In an embodiment using CMOS circuitry, the substrates includes sense and drive electrodes, multiplexing circuitry (MUX) to multiplex the interconnects from the mirror electrodes to reduce the number of connections to the outside world, e.g., wire bonds. The substrate also has drive hold circuitry (and associated control circuitry) to reduce the overhead necessary to maintain mirror position. Further details of such circuitry are provided below.

In a specific embodiment, the bonding layer can be any suitable material or materials to connect the mirror array to the substrate. The bonding layer can be a plurality of bumps 404. In one embodiment, the plurality of bumps can be made using an IBM C4 process from flip chip technology, i.e., IBM C4 process—Controlled Collapse Chip Connection— aka Flip-Chip Attach (FCA), whereby the chip to be bonded is pretreated with a solder "bump" on each of the bond pads and flipped over and aligned with the underlying substrate for reflow. This allows for high-density (100s to 1000s of interconnects) in a relatively small area. Alternatively, the bonding layer can be made using a deposition process, a screen printing process, an ink jet printing process, a photolithography process, a eutectic bonding layer, a plated bonding layer, any combination of these and the like. The integrated array and substrate are packaged in a carrier 408. In a specific embodiment, the carrier can be made of a ceramic material. Alternatively, it could be a plastic material. Bonding wires 413 connect each bonding pad 501 to an interconnect 415. Of course, the specific configuration can depend highly upon the embodiment.

Figure 5:
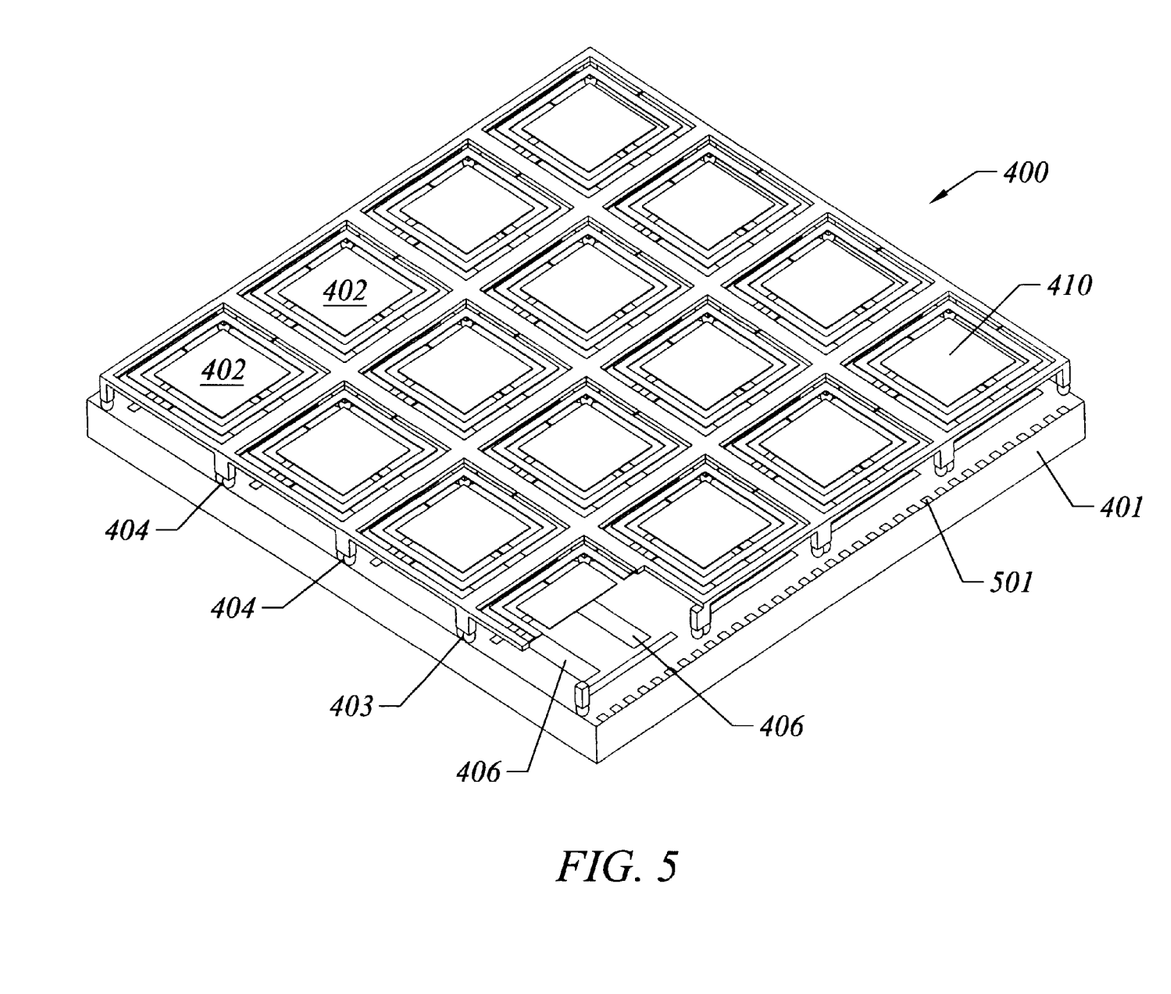
FIG. 5 is a more detailed diagram of a mirror coupled to a group of electrodes according to an embodiment of the present invention.

FIG. 5 is a more detailed diagram of a mirror array coupled to a group of electrodes shown in three dimensions 400 according to an embodiment of the present invention. This diagram is merely an example which should not unduly limit the scope of the claims herein. One of ordinary skill in the art would recognize many other variations, modifications, and alternatives. Like reference numerals are used in this Fig. as some of the others, but are not intended to be limiting. As shown, the mirror array 410 couples to substrate 401, which was previously detached from the mirror array. The mirror array can be one of the above, as well as others, which are driven by electrode devices. The mirror array and substrate couple to each other through bonding layer 403. The substrate is often a silicon substrate, which can be made using a semiconductor fabrication process or processes. The silicon substrate can include a variety of electrical circuits for driving electrodes 406, which move each one of the mirrors 402 on the mirror array.

As shown, the silicon substrate has a plurality of electrode groups 406 an upper surface portion of the substrate. A dielectric layer underlies the electrode groups. Each of the electrodes couples to lines, which couple to drive circuitry. The dielectric layer can be any suitable material such as silicon dioxide, aluminun dioxide, silicon nitride, doped silicon glass, spin-on-glass, and the like. The dielectric layer can be a single layer or multiple layers. The electrodes groups are made of a suitable conductive material, such as aluminum, copper, aluminum alloys, and the like. The material can also be titanium, tungsten, or other barrier type material. The electrodes can also be any combination of these, as well as others. In some embodiments, a dielectric layer or insulating layer can be formed overlying the electrodes. The dielectric layer can be used to protect the electrodes. The dielectric layer can be can be any suitable material such as silicon dioxide, silicon nitride, doped silicon glass, spin-on-glass, and the like. The dielectric layer can be a single layer or multiple layers. The dielectric layer, however, is thin enough to allow the electrodes to influence movement of the mirrors on the array.

The substrate includes at least first and second metal layers. A third metal layer can also be included. The second metal layer can be used for the electrodes 406, as noted above. The first metal layer can be used for integrated circuit elements including drive circuitry, sense electrodes for the mirror, which are able to pick up the very low capacitance values without suffering the noise from the interconnects. The substrate can be made using technology of NMOS, CMOS, bipolar, or any combination of these. In an embodiment using CMOS circuitry, the substrates includes sense and drive electrodes, multiplexing circuitry (MUX) to multiplex the interconnects from the mirror electrodes to reduce the number of connections to the outside world, e.g., wire bonds. The substrate also has drive hold circuitry (and associated control circuitry) to reduce the overhead necessary to maintain mirror position. Further details of such circuitry are provided below.

In a specific embodiment, the bonding layer can be any suitable material or materials to connect the mirror array to the substrate. The bonding layer can be a plurality of bumps 404. In one embodiment, the plurality of bumps can be made using an IBM C4 process from flip chip technology, i.e., IBM C4 process—Controlled Collapse Chip Connection— aka Flip-Chip Attach (FCA), whereby the chip to be bonded is pretreated with a solder "bump" on each of the bond pads and flipped over and aligned with the underlying substrate for reflow. This allows for high-density (100s to 1000s of interconnects) in a relatively small area. The integrated array and substrate are packaged in a carrier. Alternatively, the bonding layer can be made using a deposition process, a screen printing process, an ink jet printing process, a photolithography process, a eutectic bonding layer, a plated bonding layer, any combination of these and the like. In a specific embodiment, the carrier can be made of a ceramic material. Alternatively, it could be a plastic material. Bonding wires connect each bonding pad 501 to an interconnect. As shown, the bonding pads are formed on the substrate along a periphery of the mirror array. In a specific embodiment, the bonding pads are provided on the same metal layer as the electrodes. Alternatively, the bonding pads can also be provided on a different metal layer. Of course, the specific configuration can depend highly upon the embodiment.

Figure 6:
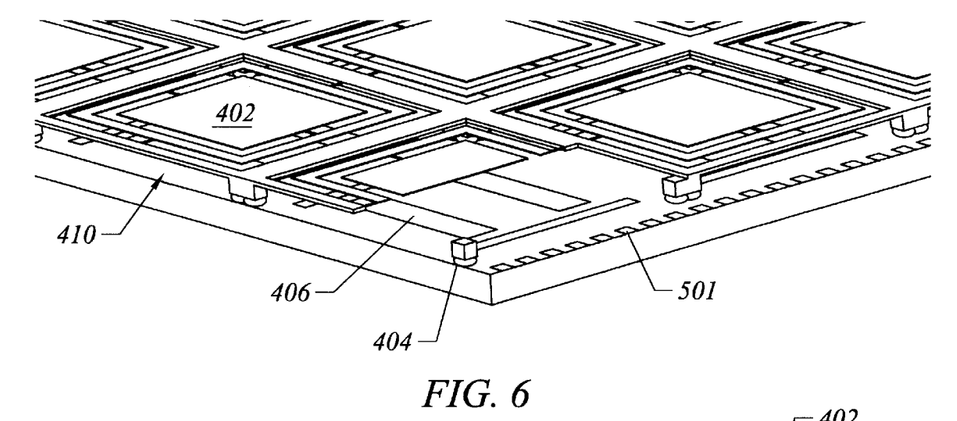
FIG. 6 is a more detailed diagram of a mirror coupled to a group of electrodes according to an embodiment of the present invention.

FIG. 6 is a more detailed diagram of a mirror array coupled to a substrate and electrodes according to an embodiment of the present invention. This diagram is merely an example which should not unduly limit the scope of the claims herein. One of ordinary skill in the art would recognize many other variations, modifications, and alternatives. Like reference numerals are used in this Fig. as some of the others, but are not intended to be limiting. As shown, the mirror array 410 couples to substrate 401, which was previously detached from the mirror array. The mirror array can be one of the above, as well as others, which are driven by electrode devices. The mirror array and substrate couple to each other through bonding layer 404, which includes each 404 of the bonding bumps. The substrate is often a silicon substrate, which can be made using a semiconductor fabrication process or processes. The silicon substrate can include a variety of electrical circuits for driving electrodes 406, which move each one of the mirrors 402 on the mirror array.

As shown, the silicon substrate has a plurality of electrode groups 406 on an upper surface portion of the substrate. A dielectric layer underlies the electrode groups. Each of the electrodes couples to lines, which couple to drive circuitry. The dielectric layer can be any suitable material such as silicon dioxide, silicon nitride, doped silicon glass, spin-on-glass, and the like. The dielectric layer can be a single layer or multiple layers. The electrodes groups are made of a suitable conductive material, such as aluminum, copper, gold, aluminum alloys, and the like. The material can also be titanium, tungsten, or other barrier type material. The electrodes can also be any combination of these, as well as others. In some embodiments, a dielectric layer or insulating layer can be formed overlying the electrodes. The dielectric layer can be used to protect the electrodes. The dielectric layer can be can be any suitable material such as silicon dioxide, silicon nitride, doped silicon glass, spin-on-glass, and the like. The dielectric layer can be a single layer or multiple layers. The dielectric layer, however, is thin enough to allow the electrodes to influence movement of the mirrors on the array.

The substrate includes at least first and second metal layers. The second metal layer can be used for the electrodes, as noted above. The first metal layer can be used for integrated circuit elements including drive circuitry, sense electrodes for the mirror, which are able to pick up the very low capacitance values without suffering the noise from the interconnects. The substrate can be made using technology of NMOS, CMOS, bipolar, or any combination of these. In an embodiment using CMOS circuitry, the substrates includes sense and drive electrodes, multiplexing circuitry (MUX) to multiplex the interconnects from the mirror electrodes to reduce the number of connections to the outside world, e.g., wire bonds. The substrate also has drive hold circuitry (and associated control circuitry) to reduce the overhead necessary to maintain mirror position. Further details of such circuitry are provided below.

In a specific embodiment, the bonding layer can be any suitable material or materials to connect the mirror array to the substrate. The bonding layer can be a plurality of bumps 404. In one embodiment, the plurality of bumps can be made using an IBM C4 process from flip chip technology, i.e., IBM C4 process—Controlled Collapse Chip Connection—aka Flip-Chip Attach (FCA), whereby the chip to be bonded is pretreated with a solder "bump" on each of the bond pads and flipped over and aligned with the underlying substrate for reflow. This allows for high-density (100s to 1000s of interconnects) in a relatively small area. Alternatively, the bonding layer can be made using a deposition process, a screen printing process, an ink jet printing process, a photolithography process, a eutectic bonding layer, a plated bonding layer, any combination of these and the like. The integrated array and substrate are packaged in a carrier 408.

In a specific embodiment, the carrier can be made of a ceramic material. Alternatively, it could be a plastic material. Bonding wires connect each bonding pad 501 to an interconnect. As shown, the bonding pads are formed on the substrate along a periphery of the mirror array. Of course, the specific configuration can depend highly upon the embodiment.

Figure 7:
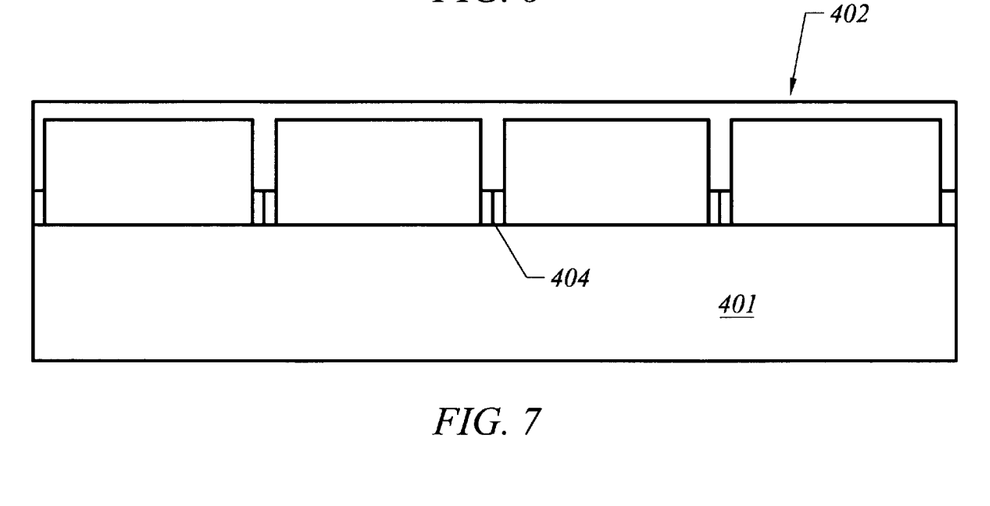
FIG. 7 is a detailed side view diagram of a mirror coupled to a substrate and electrodes according to an embodiment of the present invention.

FIG. 7 is a detailed side view diagram of a mirror array coupled to a substrate and electrodes according to an embodiment of the present invention. This diagram is merely an example which should not unduly limit the scope of the claims herein. One of ordinary skill in the art would recognize many other variations, modifications, and alternatives. Like reference numerals are used in this Fig. as some of the others, but are not intended to be limiting. The side view diagram includes substrate 401, bonding layer bumps 404, mirror 402, and other elements. The silicon substrate has a plurality of electrode groups on an upper surface portion of the substrate. A dielectric layer underlies the electrode groups. Each of the electrodes couples to lines, which couple to drive circuitry. The dielectric layer can be any suitable material such as silicon dioxide, aluminum dioxide, silicon nitride, doped silicon glass, spin-on-glass, and the like. The dielectric layer can be a single layer or multiple layers. The electrodes groups are made of a suitable conductive material, such as aluminum, copper, aluminum alloys, gold, and the like. The material can also be titanium, tungsten, or other barrier type material. The electrodes can also be any combination of these, as well as others. In some embodiments, a dielectric layer or insulating layer can be formed overlying the electrodes. The dielectric layer can be used to protect the electrodes. The dielectric layer can be can be any suitable material such as silicon dioxide, silicon nitride, doped silicon glass, spin-on-glass, and the like. The dielectric layer can be a single layer or multiple layers. The dielectric layer, however, is thin enough to allow the electrodes to influence movement of the mirrors on the array. An example of functionality that can be performed using any one of these integrated devices is provided below.

Figure 8:
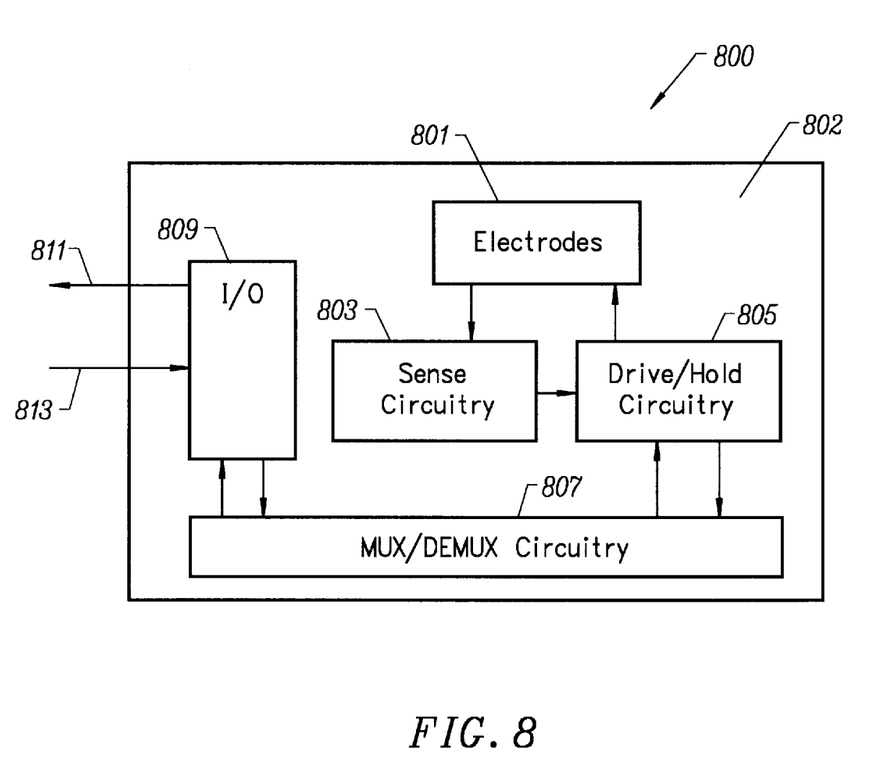
FIG. 8 is a simplified block diagram of functional blocks in a mirror array device according to an embodiment of the present invention.

FIG. 8 is a simplified block diagram 800 of functional blocks in a mirror array device according to an embodiment of the present invention. This diagram is merely an example which should not unduly limit the scope of the claims herein. One of ordinary skill in the art would recognize many other variations, modifications, and alternatives. The block diagram 800 includes substrate 802. The substrate has a variety of functional blocks such as electrodes 801, drive/hold circuitry 805, multiplexing/demultiplexing circuitry 807, sense circuitry 803, an I/O circuit 809, and others. The above blocks are used to perform operations of the mirror array. Here, the operations include switching the position of any one of the mirrors in the array from a first position to a second position. The operations also includes maintaining a present position of any one of the mirrors. These and other examples are provided below in more detail. One of ordinary skill in the art would recognize, however, many other alternatives, modifications, and variations.

A method according to the present invention may be briefly provided as follows:

(1) Select a position for switching one of the input beam signals from a mirror on an input fiber bundle to an output fiber in an output array using a controller;

(2) Derive position signals from the controller, which has a lookup table including voltages in reference to angular positions for each of the mirrors;

(3) Address selected mirror using multiplexing/demultiplexing circuitry;

(4) Transfer x-data and y-data from lookup table from controller through digital signal lines to integrated circuit elements;

(5) Store x-data and y-data into respective registers;

(6) Convert x-data and y-data into analog signals through digital analog converters;

(7) Compare present position with new selected position through sense circuitry, while maintaining present position, e.g., error correction;

(8) If present position is different from new position, switch the mirror position by transmitting voltage signals to drive circuitry;

(9) Drive electrode or electrode pair to move mirror from present position to new position;

(10) Maintain mirror position by supplying selected signals from the controller to the drive circuitry; and (11) Perform other steps, as desired.

The above sequence of steps is merely an example, which should not unduly limit the scope of the claims herein. As shown, the present steps provide a way to actuate or switch one of the mirrors in the array from a first position to a second position to direct a beam from an input fiber to any one of a plurality of output fibers. Alternatively, the steps can be used to maintain a present position of any one of the mirrors, where the mirror may move in one direction or another direction due to noise or the like. Further details of these steps are provided in reference to the Fig. below.

Figure 9:
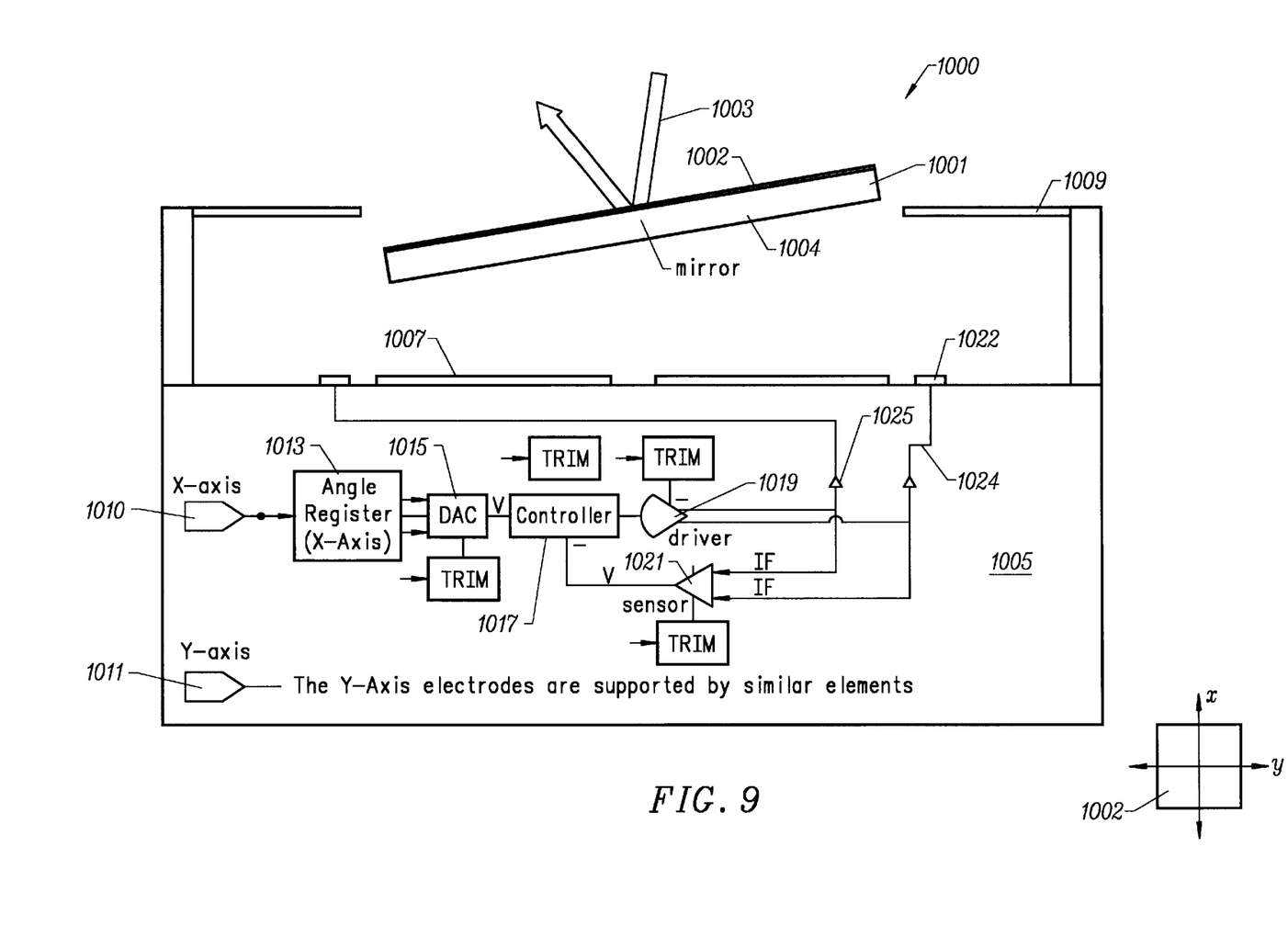
FIG. 9 is a simplified diagram of a switching device according to an embodiment of the present invention.

FIG. 9 is a simplified diagram 1000 illustrating a method and device according to an embodiment of the present invention. This diagram is merely an example which should not unduly limit the scope of the claims herein. One of ordinary skill in the art would recognize many other variations, modifications, and alternatives. Here, a user selects a position for switching one of the input beam signals 1003 from one of the output fibers in the array of a switching device using a controller via a high level network management interface device. The switching device can be similar to the one noted above but can also be others. For example, the switching device can also be similar to the one described in U.S. Pat. No. 6,044,705 assigned to Xros, Inc., Sunnyvale, Calif. describes such a mirror in a specific manner. It would be recognized by one of ordinary skill in the art that many other variations, alternatives, and modifications can exist. The switching device includes substrate 1005, which includes a variety of integrated circuit elements for sensing and controlling any one of the mirrors in the mirror array. The substrate also includes electrodes 1007, which are coupled to the substrate. The substrate also includes a housing 1009, which holds a mirror 1001 from a mirror array. Signals of the selected position are derived from the controller, which has a lookup table including voltages in reference to angular positions for each of the mirrors. The lookup table has been provided from a calibration technique, which references voltage information with mirror positions for each mirror on the array. The signals include address information to selected a particular mirror from the array. Additionally, the signals include position information to selectively position the mirror to redirect a beam from an input fiber to an output fiber. Here, the controller sends signals to address the selected mirror using multiplexing/demultiplexing circuitry, for example. Next, the controller transfers position information including x-data and y-data from the lookup table through digital signal lines to integrated circuit elements. As shown, the x-data are provided on line 1010 and the y-data are provided on line 1011. The x-data are stored in register 1013, which maintains the data for use in the other circuit elements. Next, the x-data are converted from digital format into analog using the digital to analog converter (DAC) 1015 for use in the circuit elements.

The analog data representing the x-data are provided to controller 1017. The controller oversees the operation of the spatial positioning of the mirror 1001. As shown, the mirror includes a mirror surface 1002, which is disposed on a substrate 1004. In a specific embodiment, the controller monitors the present position of the mirror. Here, the mirror has certain positions relative to at least two axis, including an x-position and a y-position. The mirror pivots along the x-direction and also pivots along the y-direction to direct the beam from a selected input fiber to any one of a plurality of output fibers. The mirror has a variety of spatial positions. The controller receives signals from selected regions 1022 of the substrate to sensor 1021. As shown, the substrate includes a separate sense and drive electrode, which may be combined in other embodiments. The controller often compares the present position of the mirror with a new predetermined position of the mirror through sense circuitry, while maintaining the present position. Alternatively, the controller merely provides control feedback to the drive circuitry 1019 to maintain the position of the mirror. If the new predetermined position is different from the present position, the controller switches the mirror position by transmitting voltage signals to drive circuitry. The drive circuitry drives an electrode or electrode pair to move the mirror from the present position to the new predetermined position, which redirects a beam from an input fiber to one of the output fibers. Once the mirror is in the new predetermined position, the controller maintains the position by monitoring the position feedback from a sensing device and selectively applying voltage to one or more of the electrodes 1007, as needed.

The signals for the movement of the y-direction are similar in concept to the description above. The analog data representing the y-data are provided to controller 1017. The controller oversees the operation of the spatial positioning of the mirror 1001. As shown, the mirror includes a mirror surface 1002, which is disposed on a substrate 1004. In a specific embodiment, the controller monitors the present position of the mirror. Here, the mirror has certain positions relative to at least two axis, including an x-position and a y-position. The mirror pivots along the y-direction and also pivots along the x-direction, which has been explained, to direct the beam from a selected input fiber to any one of a plurality of output fibers. The mirror has a variety of spatial positions. The controller receives signals from selected regions of the substrate to a sensor. The controller often compares the present position of the mirror with a new predetermined position of the mirror through sense circuitry, while maintaining the present position. Alternatively, the controller merely provides control feedback to the drive circuitry to maintain the position of the mirror. If the new predetermined position is different from the present position, the controller switches the mirror position by transmitting voltage signals to drive circuitry. The drive circuitry drives an electrode or electrode pair to move the mirror from the present position to the new predetermined position, which redirects a beam from an input fiber to one of the output fibers. Once the mirror is in the new predetermined position, the controller maintains the position by selectively applying voltage to the electrodes.

One of ordinary skill in the art would recognize many other variations, modifications, and alternatives. The above example is merely an illustration, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An integrated circuit and mirror device, the device comprising:
   a first substrate comprising a plurality of electrode groups, each of the groups comprising a plurality of electrodes;
   a mirror array formed on a second substrate, each of the mirrors on the array having a mirror surface being able to pivot about a point in space, each of the mirrors having a backside surface operably coupled to one of the electrode groups;
   a bonding layer mechanically coupling the first substrate to the second substrate, whereupon the backside surface of each mirror faces one of the electrode groups;
   a drive circuitry coupled to each electrode groups, the drive circuitry being configured to apply a voltage to any one of the electrodes in each of the electrode groups, the drive circuitry being disposed in the first substrate and being adapted to pivot each of the mirror faces about the point in space; and
   an input/output circuit coupled to each of the electrodes.

2. The device of claim 1 wherein the mirror array comprises at least an eight by eight array of mirrors.

3. The device of claim 2 wherein the mirror array comprises at least a 100 by 100 array of mirrors.

4. An integrated circuit and mirror device, the device comprising:
   a first substrate comprising a plurality of electrode groups, each of the groups comprising a plurality of electrodes;
   a mirror array formed on a second substrate, each of the mirrors on the array having a mirror surface being able to pivot about a point in space, each of the mirrors having a backside surface operably coupled to one of the electrode groups;
   a bonding layer mechanically coupling the first substrate to the second substrate, whereupon the backside surface of each mirror faces one of the electrode groups;
   a drive circuitry coupled to each electrode groups, the drive circuitry being configured to apply a voltage to any one of the electrodes in each of the electrode groups, the drive circuitry being disposed in the first substrate and being adapted to pivot each of the mirror faces about the point in space; and
   a sense circuit coupled to each of the electrodes.

5. An integrated circuit and mirror device, the device comprising:
   a first substrate comprising a plurality of electrode groups, each of the groups comprising a plurality of electrodes;
   a mirror array formed on a second substrate, each of the mirrors on the array having a mirror surface being able to pivot about a point in space, each of the mirrors having a backside surface operably coupled to one of the electrode groups;
   a bonding layer mechanically coupling the first substrate to the second substrate, whereupon the backside surface of each mirror faces one of the electrode groups;
   a drive circuitry coupled to each electrode groups, the drive circuitry being configured to apply a voltage to any one of the electrodes in each of the electrode groups, the drive circuitry being disposed in the first substrate and being adapted to pivot each of the mirror faces about the point in space; and
   a multiplexing circuit coupled to the drive circuitry.

6. The device of claim 1 wherein the bonding layer comprises a plurality of bumps, each of the bumps being spatially positioned between the first substrate and the second substrate to align each of the mirrors to its respective electrode group.

7. The device of claim 1 wherein a plurality of pads couple to the input/output circuit.

8. The device of claim 7 wherein each of the pads is attached to a pin using a process selected from wire bonding or tape bonding.

9. The device of claim 1 further comprising a packaging material holding the first substrate and the second substrate.

10. An integrated circuit and mirror device, the device comprising:
    a first substrate comprising a plurality of electrode groups, each of the groups comprising a plurality of electrodes;
    a mirror array formed on a second substrate, each of the mirrors on the array having a mirror surface being able to pivot about a point in space, each of the mirrors having a backside surface operably coupled to one of the electrode groups;
    a bonding layer mechanically coupling the first substrate to the second substrate, whereupon the backside surface of each mirror faces one of the electrode groups;
    a drive circuitry coupled to each electrode groups, the drive circuitry being configured to apply a voltage to any one of the electrodes in each of the electrode groups, the drive circuitry being disposed in the first substrate and being adapted to pivot each of the mirror faces about the point in space;
    a sense circuit coupled between each of the electrodes and the drive circuitry;
    an input/output circuit coupled to the drive circuitry; and
    a plurality of pads coupled to the input/output circuit.

11. The device of claim 10 wherein each of the mirrors comprises a plurality of torsion bars to adjust a spatial orientation of the mirror to pivot the mirror about the point in space.

12. The device of claim 10 wherein the bonding layer comprises a dielectric layer disposed on the plurality of electrode groups.

13. The device of claim 10 wherein the bonding layer comprises a plurality of bumps, each of the bumps being spatially positioned between the first substrate and the second substrate to align each of the mirrors to its respective electrode group.

14. The device of claim 10 wherein the bonding layer is provided by a C4 process.

15. The device of claim 10 wherein the bonding layer is provided by flip chip bumps.

16. The device of claim 10 wherein the bonding layer is provided by a screen printing process.

17. The device of claim 10 wherein the bonding layer is provided by a eutectic layer.

18. The device of claim 10 wherein the bonding layer is provided by a process selected from a deposition process, an ink jet printing process, a photolithography process, or a plating process.

19. An integrated circuit and mirror device, the device comprising:
    a first substrate comprising a plurality of active switching devices and an overlying layer comprising a plurality of electrode groups, each of the groups comprising a plurality of electrodes, the plurality of active switching devices including a transistor selected from at least a CMOS device, a bipolar device, a BiCMOS device, or an NMOS device;

a mirror array formed on a second substrate, each of the mirrors on the array having a mirror surface being able to pivot about a point in space, each of the mirrors having a backside surface operably coupled to one of the electrode groups;

a bonding layer mechanically coupling the first substrate to the second substrate, whereupon the backside surface of each mirror faces one of the electrode groups;

a drive circuitry coupled to each electrode groups, the drive circuitry being configured to apply a voltage to any one of the electrodes in each of the electrode groups, the drive circuitry being disposed in the first substrate and being adapted to pivot each of the mirror faces about the point in space;

a sense circuit coupled between each of the electrodes and the drive circuitry;

an input/output circuit coupled to the drive circuitry; and a plurality of pads coupled to the input/output circuit.

20. The device of claim 4 wherein the mirror array comprises at least an eight by eight array of mirrors.

21. The device of claim 4 wherein the mirror array comprises at least a 100 by 100 array of mirrors.

22. The device of claim 4 further comprising a packaging material holding the first substrate and the second substrate.

23. The device of claim 5 wherein the mirror array comprises at least an eight by eight array of mirrors.

24. The device of claim 5 wherein the mirror array comprises at least a 100 by 100 array of mirrors.

25. The device of claim 5 further comprising a packaging material holding the first substrate and the second substrate.

* * * * *